US012347500B2

United States Patent
Cho et al.

(10) Patent No.: US 12,347,500 B2
(45) Date of Patent: Jul. 1, 2025

(54) MEMORY DEVICE INCLUDING VERTICAL CHANNEL STRUCTURE

(71) Applicant: Samsung Electronics Co., Ltd., Suwon-si (KR)

(72) Inventors: Yongsung Cho, Hwaseong-si (KR); Minjae Seo, Hwaseong-si (KR); Kyoman Kang, Gunpo-si (KR); Byungsoo Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 17/881,039

(22) Filed: Aug. 4, 2022

(65) Prior Publication Data
US 2023/0104865 A1   Apr. 6, 2023

(30) Foreign Application Priority Data
Sep. 29, 2021   (KR) .................. 10-2021-0128950

(51) Int. Cl.
*G11C 16/30* (2006.01)
*G11C 16/04* (2006.01)
*G11C 16/08* (2006.01)
*G11C 16/26* (2006.01)

(52) U.S. Cl.
CPC .......... *G11C 16/30* (2013.01); *G11C 16/0483* (2013.01); *G11C 16/08* (2013.01); *G11C 16/26* (2013.01)

(58) Field of Classification Search
CPC ..... G11C 16/30; G11C 16/0483; G11C 16/08; G11C 16/26; G11C 16/3427; G11C 5/145; G11C 8/10; G11C 8/14; H10B 43/10; H10B 43/27

USPC ..................................... 365/230.05
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

OTHER PUBLICATIONS

EESR dated Feb. 20, 2023 for corresponding EP Patent Application No. 22193826.9.

(Continued)

*Primary Examiner* — Huan Hoang
*Assistant Examiner* — Daniel J King
(74) *Attorney, Agent, or Firm* — Harness, Dickey & Pierce, P.L.C.

(57) ABSTRACT

Provided is a memory device with a vertical channel structure. The memory device includes a memory cell array including a plurality of memory cells and a plurality of string selection lines, a negative charge pump configured to generate a bias voltage of a negative level, to be applied to at least one of the plurality of string selection lines, and a control logic circuit configured to apply, for a first period, a prepulse voltage to at least one unselected string selection line among the plurality of string selection lines excluding a selected string selection line to which a memory cell selected from among the plurality of memory cells is connected and thereafter apply the bias voltage to the at least one unselected string selection line so as to perform a read operation on the selected memory cell.

20 Claims, 21 Drawing Sheets

(56) References Cited

U.S. PATENT DOCUMENTS

| | | |
|---|---|---|
| 8,830,751 B2 | 9/2014 | Maejima et al. |
| 9,030,869 B2 | 5/2015 | Yun et al. |
| 9,190,151 B2 | 11/2015 | Nam et al. |
| 10,090,056 B2 | 10/2018 | Hioka |
| 10,832,782 B2 | 11/2020 | Park |
| 10,910,060 B1 | 2/2021 | Wu et al. |
| 2002/0171470 A1* | 11/2002 | Sim ................. G11C 16/30 327/536 |
| 2011/0233648 A1 | 9/2011 | Seol et al. |
| 2015/0318045 A1 | 11/2015 | Yun |
| 2016/0027514 A1 | 1/2016 | Sim et al. |
| 2018/0137925 A1* | 5/2018 | Nam ................. G11C 16/28 |
| 2021/0090665 A1 | 3/2021 | Funatsuki et al. |

OTHER PUBLICATIONS

Office Action for Korean Application No. 10-2021-0128950 dated May 2, 2025.

\* cited by examiner

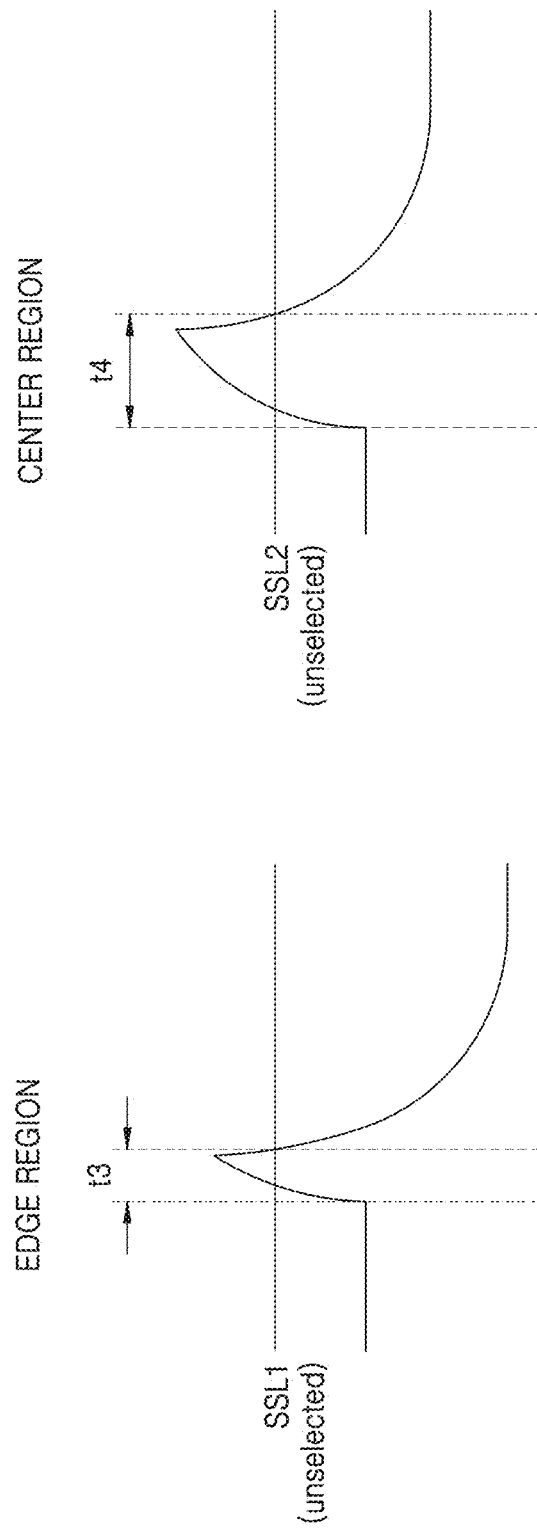

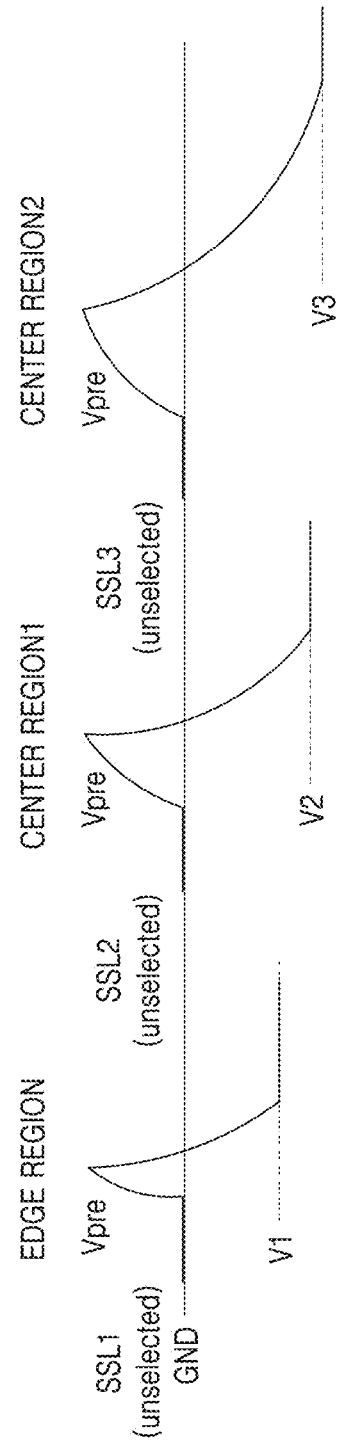

MEMORY DEVICE INCLUDING VERTICAL CHANNEL STRUCTURE

CROSS-REFERENCE TO RELATED APPLICATION

This application is based on and claims priority under 35 U.S.C. § 119 to Korean Patent Application No. 10-2021-0128950, filed on Sep. 29, 2021, in the Korean Intellectual Property Office, the disclosure of which is incorporated by reference herein in its entirety.

BACKGROUND

The inventive concepts relate to memory devices, and more particularly, to memory devices with a plurality of vertical channel structures.

Vertical memory devices have been developed in response to the demand for high-capacity and small-sized non-volatile memory devices. The vertical memory devices refer to memory devices including a plurality of memory cells or memory cell arrays stacked vertically on a substrate. In the case of a vertical memory device with channel holes in the form of a multi-holes, among the vertical memory devices, characteristics of memory cells formed in the channel holes may vary with the distance between the channel holes and an isolation region adjacent thereto. A change in the characteristics of the memory cells may result in an increase in a time required to perform data operations.

SUMMARY

The inventive concepts relate to providing memory devices with vertical channel structures in which a voltage of a negative level is applied to unselected string selection lines after a prepulse voltage is applied thereto.

According to some example embodiments, a memory device includes a memory cell array including a plurality of memory cells and a plurality of string selection lines, a negative charge pump configured to generate a bias voltage of a negative level to be applied to at least one of the plurality of string selection lines, and a control logic circuit configured to apply, for a first period, a prepulse voltage to at least one unselected string selection line among the plurality of string selection lines excluding a selected string selection line to which a memory cell selected from among the plurality of memory cells is connected and thereafter apply the bias voltage to the at least one unselected string selection line so as to perform a read operation on the selected memory cell.

According to some example embodiments, a memory device for performing a read operation on a selected memory cell includes a memory cell array including a plurality of memory cells and a plurality of string selection lines, a negative charge pump configured to generate a bias voltage of a negative level to be applied to an unselected string selection line among the plurality of string selection lines excluding a string selection line to which the selected memory cell of the plurality of memory cells is connected, and a row decoder configured to apply a prepulse voltage to the unselected string selection line for a first period and thereafter apply the bias voltage thereto for a second period.

According to some example embodiments, a memory device includes a memory cell array including a first word line cut region and a second word line cut region, a plurality of string selection line cut regions between the first and second word line cut regions, a plurality of vertical channel structures between the first word line cut region and the plurality of string selection line cut regions, between the second word line cut region and the plurality of string selection line cut regions, and between adjacent string selection line cut regions among the plurality of string selection line cut regions; and a control logic circuit configured to apply a prepulse voltage to a first string selection line and a second string selection line connected to a plurality of unselected memory cells so as to perform a read operation on a selected memory cell, divide the plurality of vertical channel structures into first vertical channel structures and second vertical channel structures according to a distance to an adjacent word line cut region among the first and second word line cut regions, and apply different voltages to the first string selection line connected to the first vertical channel structures and the second string selection line connected to the second vertical channel structures after application of the prepulse voltage.

BRIEF DESCRIPTION OF THE DRAWINGS

Example embodiments of the inventive concepts will be more clearly understood from the following detailed description taken in conjunction with the accompanying drawings in which:

FIG. 6A is a view illustrating a prepulse operation performance time according to some example embodiments of the inventive concepts;

FIG. 15A is a view illustrating voltages applied to string selection lines according to some example embodiments of the inventive concepts;

DETAILED DESCRIPTION OF THE EMBODIMENTS

Hereinafter, example embodiments of the inventive concepts will be described in detail with reference to the accompanying drawings.

Figure 1:
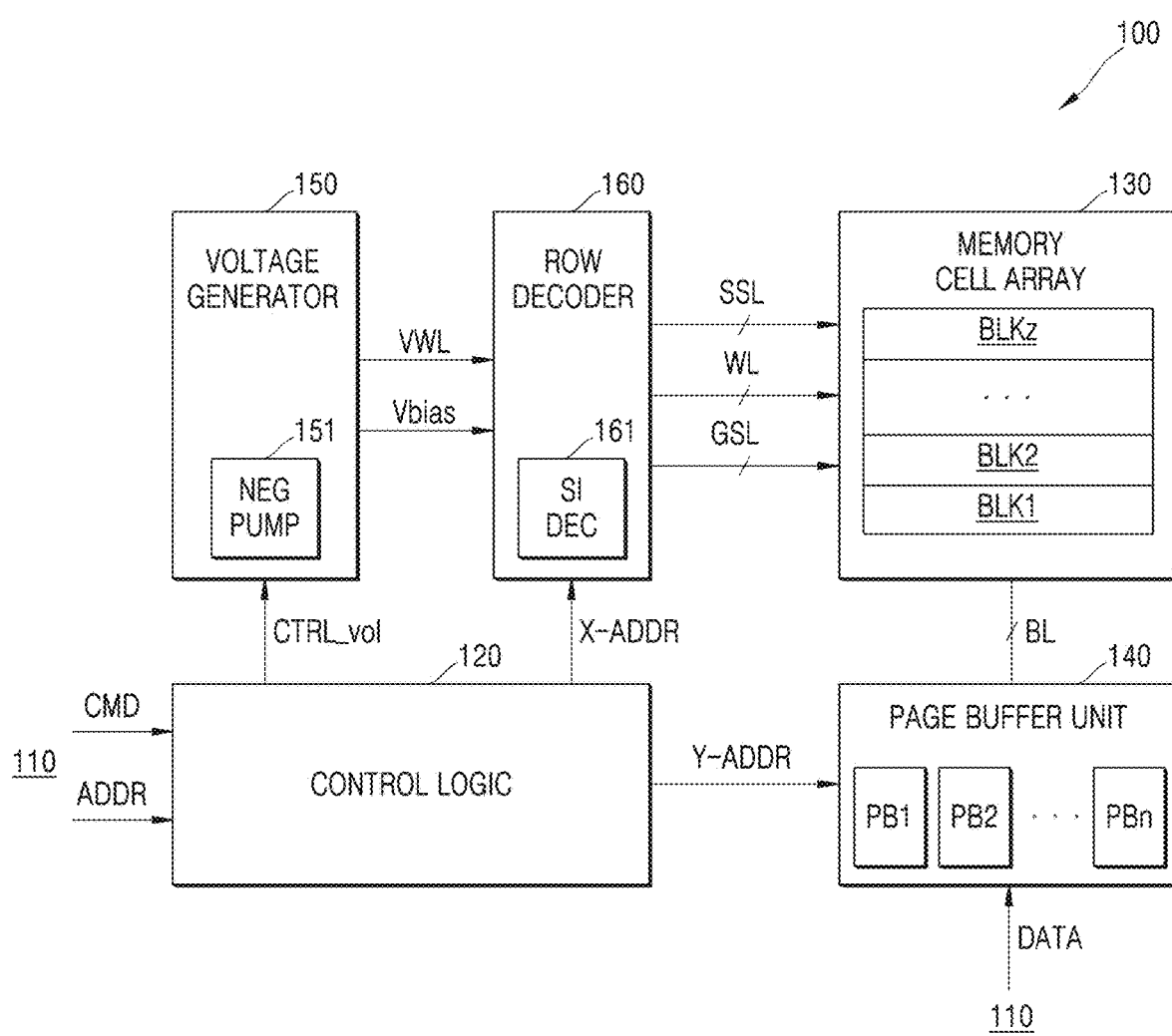
FIG. 1 is a block diagram of a memory device according to some example embodiments of the inventive concepts.

FIG. 1 is a block diagram of a memory device according to some example embodiments of the inventive concepts.

Referring to FIG. 1, a memory device 100 may include a control logic circuit 120, a memory cell array 130, a page buffer unit 140, a voltage generator 150, and a row decoder 160. Although not shown in FIG. 1, the memory device 100 may further include a memory interface circuit and may further include a column logic, a pre-decoder, a temperature sensor, a command decoder, an address decoder, and the like.

The control logic circuit 120 may generally control various operations in the memory device 100. The control logic circuit 120 may output various control signals in response to a command CMD and/or an address ADDR from the memory interface circuit 110. For example, the control logic circuit 120 may output a voltage control signal CTRL vol, a row address X-ADDR, and a column address Y-ADDR.

The memory cell array 130 may include a plurality of memory blocks BLK1 to BLKz (z is a positive integer), and each of the plurality of memory blocks BLK1 to BLKz may include a plurality of memory cells. The memory cell array 130 may be connected to the page buffer unit 140 through bit lines BL and connected to the row decoder 160 through word lines WL, string selection lines SSL, and ground selection lines GSL. The memory cell array 130 may further include a plurality of word lines stacked on the substrate in a vertical direction and connected to the plurality of memory cells.

In some example embodiments, the memory cell array 130 may include a three-dimensional (3D) memory cell array, and the 3D memory cell array may include a plurality of NAND strings. Each of the NAND strings may include memory cells connected to the word lines stacked on the substrate in the vertical direction. U.S. Pat. Nos. 7,679,133, 8,553,466, 8,654,587, 8,559,235, and U.S. Pat. No. 2011/0233648 are incorporated herein in their entirety by reference. In some example embodiments, the memory cell array 130 may include a two-dimensional (2D) memory cell array and the 2D memory cell array may include a plurality of NAND strings arranged in row and column directions.

The page buffer unit 140 may include a plurality of page buffers PB1 to PBn (n is an integer greater than or equal to 3), and the plurality of page buffers PB1 to PBn may be connected to the memory cells through the bit lines BL. The page buffer unit 140 may select at least one of the bit lines BL in response to the column address Y-ADDR. The page buffer unit 140 may function as a write driver or a sense amplifier according to an operating mode. For example, during a program operation, the page buffer unit 140 may apply a bit line voltage corresponding to data to be programmed to a selected bit line. During a read operation, the page buffer unit 140 may sense data stored in a memory cell by sensing a current or voltage of a selected bit line.

The voltage generator 150 may generate various types of voltages for performing the program operation, the read operation, an erase operation, etc., based on the voltage control signal CTRL vol. For example, the voltage generator 150 may generate a program voltage, a read voltage, a program-verify voltage, an erase voltage, or the like as a word line voltage VWL.

The voltage generator 150 may include a negative charge pump 151. The negative charge pump 151 may generate a voltage of a negative level. A voltage generated by the negative charge pump 151 may be provided to a pocket well of a transistor having a triple-well structure and provided to a plurality of string selection lines through a signal line decoder 161. In the present disclosure, the voltage provided to the plurality of string selection lines from the negative charge pump 151 is referred to as a bias voltage Vbias. That is, a level of the bias voltage Vbias may be negative.

Alternatively, the negative charge pump 151 may generate a plurality of voltages gradually increasing from a level of a ground voltage to a target level. For example, gradually may refer to a smooth (e.g., not step-wise) concave or convex curve from the level of the ground voltage to the target level. In some example embodiments, gradually may refer to a step-wise increase of discrete amounts, such as about ⅓ or about 10% of a difference between the level of the ground voltage and the target level, although other values may be used. Levels of the plurality of voltages may be negative. The target level may be understood as a level of a bias voltage Vbias, as will be described with reference to FIGS. 12 and 13 below.

The voltage generator 150 may further include a high-voltage generator for generating voltages (a program voltage, a pass voltage, a read voltage, a read pass voltage, an erase voltage, etc.) required to drive the word lines. A plurality of high voltages generated by the high-voltage generator 150 may control a plurality of switches included in the signal line decoder 161, as will be described with reference to FIGS. 7 and 10 below.

The row decoder 160 may select one of the word lines WL and one of the string selection lines SSL in response to the row address X-ADDR. For example, the row decoder 160 may apply the program voltage and the program-verify voltage to the selected word line during the program operation and apply the read voltage to the selected word line during the read operation.

The row decoder 160 may include the signal line decoder 161. The signal line decoder 161 may provide a word line voltage and a bias voltage Vbias received from the voltage generator 150 according to an operation, e.g., a read operation, a write operation or an erase operation, of the signal line decoder 161 to the signal lines SSL, WL and GSL. In some example embodiments, the signal line decoder 161 may provide a plurality of high voltages and the bias voltage Vbias received from the voltage generator 150 to at least one string selection line. The signal line decoder 161 may further receive a bias voltage control signal (e.g., a bias voltage control signal ctrl_bias of FIG. 7) and output the bias voltage Vbias according to the bias voltage control signal ctrl_bias.

That is, the row decoder 160 may apply a prepulse voltage to at least one string selection line, e.g., an unselected string selection line, for a first period and thereafter apply the bias voltage Vbias thereto for a second period.

Figure 2:
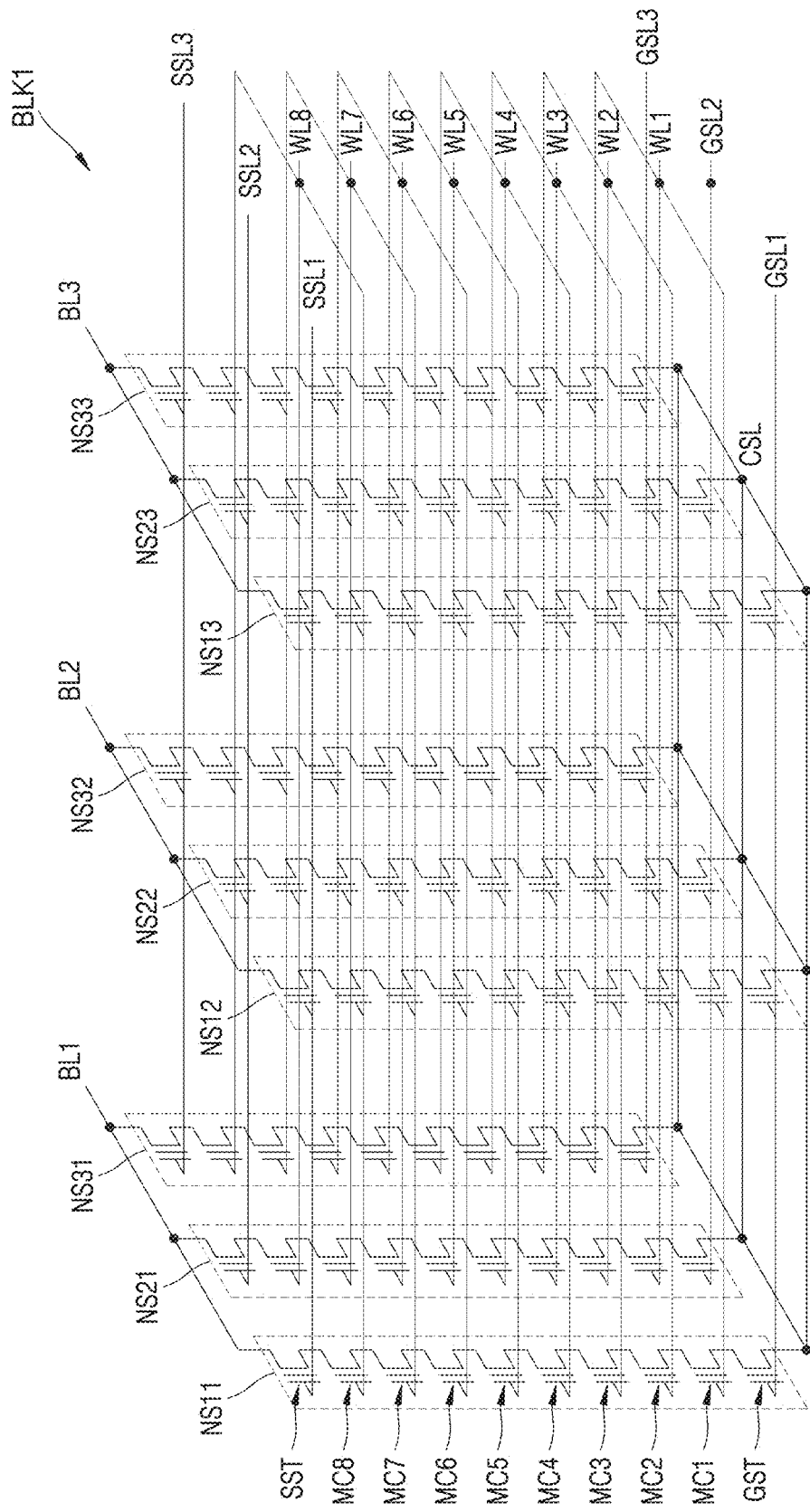
FIG. 2 is a circuit diagram of an equivalent circuit of a first memory block included in a memory cell array of FIG. 1.

FIG. 2 is a circuit diagram of an equivalent circuit of a first memory block among the memory blocks included in the memory cell array of FIG. 1.

Referring to FIGS. 1 and 2, a first memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of NAND strings, the number of word lines, the number of bit lines, the number of ground selection lines, and the number of string selection lines may be changed variously according to some example embodiments.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each NAND string (e.g., the NAND string NS11) may include a string selection transistor SST, a plurality of memory cells MC1 to MC8, and a ground selection transistor GST that are connected in series. Hereinafter, a NAND string is referred to as a string for convenience of description.

Strings connected commonly to one bit line form one column. For example, the strings NS11, NS21, and NS31 connected commonly to the first bit line BL1 may correspond to a first column, the strings NS12, NS22, and NS32 connected commonly to the second bit line BL2 may correspond to a second column, and the strings NS13, NS23, and NS33 connected commonly to the third bit line BL3 may correspond to a third column.

Strings connected to one string selection line form one row. For example, the strings NS11, NS12, and NS13 connected to the first string selection line SSL1 may correspond to a first row, the strings NS1, NS22, and NS23 connected to the second string selection line SSL2 may correspond to a second row, and the strings NS31, NS32, and NS33 connected to the third string selection line SSL3 may correspond to a third row.

The string selection transistor SST is connected to the string selection lines SSL1 to SSL3 corresponding thereto. The plurality of memory cells MC1 to MC8 are respectively connected to the word lines WL1 to WL8 corresponding thereto. The ground selection transistor GST is connected to the ground selection lines GSL1 to GSL3 corresponding thereto. The string selection transistor SST may be connected to the bit lines BL1 to BL3 corresponding thereto, and the ground selection transistor GST may be connected to the common source line CSL.

In some example embodiments, word lines (e.g., the first word line WL1) at the same height are commonly connected to each other, the string selection lines SSL1 to SSL3 are separated from each other, and the ground selection lines GSL1 to GSL3 are separated from each other. For example, when memory cells connected to the first word line WL1 and belonging to the strings NS11, NS12, and NS13 are programmed, the first word line WL1 and the first string selection line SSL1 are selected. However, the inventive concepts are not limited thereto, and the ground selection lines GSL1 to GSL3 may be commonly connected to each other.

Although FIG. 2 illustrates that each string includes one string selection transistor SST, the inventive concepts are not limited thereto and each string may include an upper string selection transistor and a lower string selection transistor that are connected in series to each other. In this case, the upper string selection transistor may be connected to the bit lines, and the lower string selection transistor may be connected between the upper string selection transistor and the memory cell MC8.

In some example embodiments, the fourth word line WL4 and the first string selection line SSL1 may be selected. That is, the fourth memory cell MC4 may be selected as a cell that is a target of the read operation. Hereinafter, a memory cell that is a target of the read operation of a verification target is referred to as a selected memory cell. Therefore, memory cells among the plurality of memory cells excluding the selected memory cell are referred to as unselected memory cells. A string selection line connected to the selected memory cell is referred to as a selected string selection line, and a string selection line connected to an unselected memory cell is referred to as an unselected string selection line. Thus, in the above example, the first string selection line SSL1 is a selected string selection line and the second and third string selection lines SSL2 and SSL3 are unselected string selection lines.

For example, in the read operation, the control logic circuit 120 may apply a turn-on voltage Von to the first string selection line SSL1. The turn-on voltage Von may turn on a string selection transistor connected to the selected string selection line SSL1.

The control logic circuit 120 may apply a turn-off voltage to the second and third string selection lines SSL2 and SSL3. The turn-off voltage may turn off string selection transistors connected to the unselected string selection lines SSL2 and SSL3. In this case, a voltage difference may occur in an upper channel and a lower channel of the selected memory cell, thus resulting in hot carrier injection (HCI). The HCI may cause deterioration of a threshold voltage of memory cells adjacent to the selected memory cell.

To prevent or reduce this problem, a prepulse voltage may be applied to the unselected string selection lines SSL2 and SSL3. For example, the control logic circuit 120 may apply the prepulse voltage to a plurality of unselected string selection lines for a first period. A level of the prepulse voltage may be positive. In the present disclosure, the first period may be referred to as a prepulse period.

According to some example embodiments of the inventive concepts, in order to perform the read operation on a memory cell selected from among a plurality of memory cells, the control logic circuit 120 may apply the prepulse voltage to at least one unselected string selection line (e.g., unselected string selection lines SSL2 and SSL3) among a plurality of string selection lines excluding the string selection line SSL1, which is selected from among the plurality of string selection lines and to which the selected memory cell is connected, for the prepulse period and thereafter apply a bias voltage Vbias of a negative level thereto. Accordingly, the prepulse period may be reduced and thus a total time necessary to perform the read operation may also be reduced.

Figure 3:
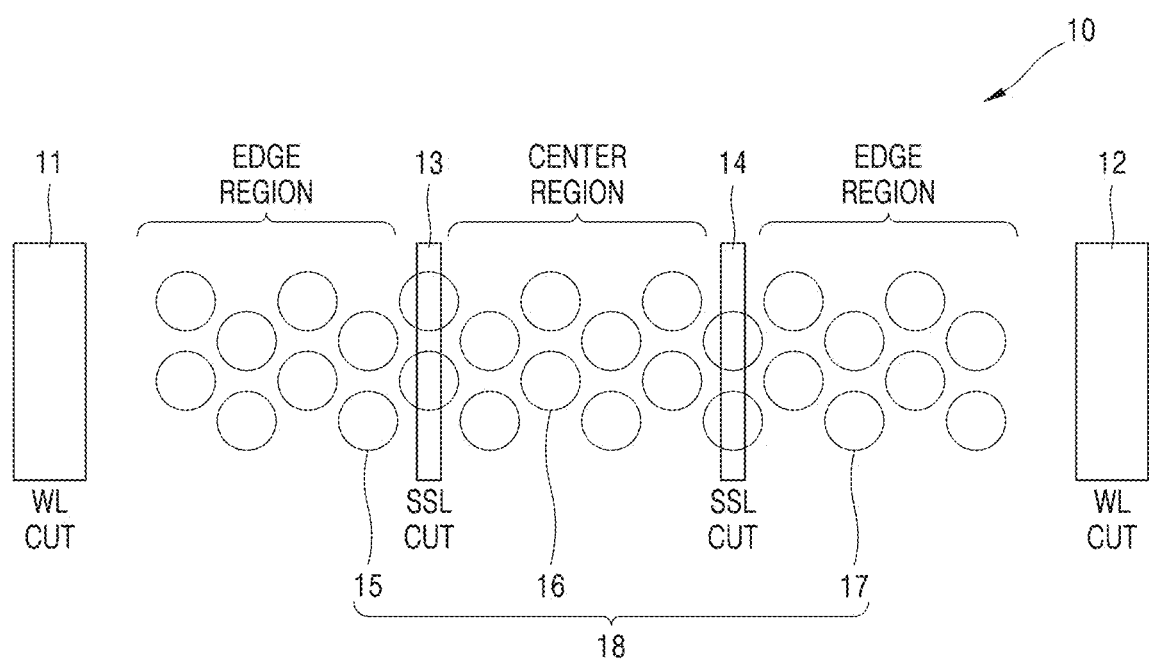
FIG. 3 is a view illustrating a layout of a memory cell array according to some example embodiments of the inventive concepts.

FIG. 3 is a view illustrating a layout of a memory cell array according to some example embodiments of the inventive concepts.

Referring to FIG. 3, a layout 10 may include first and second word line cut regions 11 and 12, first and second string selection line cut regions 13 and 14, and a plurality of vertical channel structures 18. Here, the plurality of vertical channel structures 18 may correspond to a plurality of channel holes. The first and second word line cut regions 11 and 12 and the first and second string selection line cut regions 13 and 14 may be arranged in parallel to one another.

The first and second word line cut regions 11 and 12, the first and second string selection line cut regions 13 and 14, and the plurality of vertical channel structures 18 may be formed on a substrate of the memory cell array 130 of FIG. 1.

The plurality of vertical channel structures 18 may be formed between the first word line cut region 11 and the first string selection line cut region 13, between the first string selection line cut region 13 and the second string selection line cut region 14, and between the second string selection line cut region 14 and the second word line cut region 12.

In this case, the layout 10 may be divided into a plurality of regions with respect to the first and second word line cut regions 11 and 12 and the first and second string selection line cut regions 13 and 14. A first region may be a space between the first word line cut region 11 and the first string selection line cut region 13, a second region may be a space between the first string selection line cut region 13 and the second string selection line cut region 14, and a third region may be a space between the second string selection line cut region 14 and the second word line cut region 12. In this case, a region adjacent to the first word line cut region 11 or the second word line cut region 12 may be referred to as an edge region, and a region between the first and second string selection line cut regions 13 and 14 may be referred to as a center region. Therefore, the first and third regions are edge regions and the second region is a center region.

In some example embodiments, each of the plurality of vertical channel structures 18 may be identified according to a position thereof. For example, a plurality of vertical channel structures located in the first or third region may be referred to as the first or third vertical channel structures 15 or 17, and a plurality of vertical channel structures located in the second region may be referred to as the second vertical channel structures 16.

In this case, a plurality of vertical channel structures belonging to one region may be commonly connected to one string selection line. For example, a first string selection line may be connected to the first vertical channel structure 15 belonging to the first region, a second string selection line may be connected to the second vertical channel structure 16 belonging to the second region, and a third string selection line may be connected to the third vertical channel structure 17 belonging to the third region.

In some example embodiments, each of the plurality of vertical channel structures 18 may be identified according to a distance to a word line cut region adjacent thereto. Specifically, it may be determined that the first vertical channel structure 15 belongs to an edge region, because a distance therefrom to the first word line cut region 11 adjacent thereto is less than a distance to the first word line cut region 11 from the first string selection line cut region 13 adjacent to the first vertical channel structure 15. It may be determined that the second vertical channel structure 16 belongs to the center region, because a distance therefrom to the first word line cut region 11 is greater than a distance to the first word line cut region 11 from the first string selection line cut region 13 adjacent to the second vertical channel structure 16.

In this case, a portion of the edge region excluding a plurality of channel holes may be wider than a portion of the center region excluding a plurality of channel holes. Resistances in regions may be different from each other due to the difference between areas of the regions each occupied by channel holes. A resistance of the channel holes in the center region is greater than that of the channel holes in the edge region and thus a time required to perform a prepulse operation of applying a prepulse voltage to the vertical channel structures 16 in the center region.

According to some example embodiments of the inventive concepts, a level of a bias voltage to be applied to an unselected string selection line may be determined according to whether the unselected string selection line is formed in an edge region or the center region.

Figure 4A:
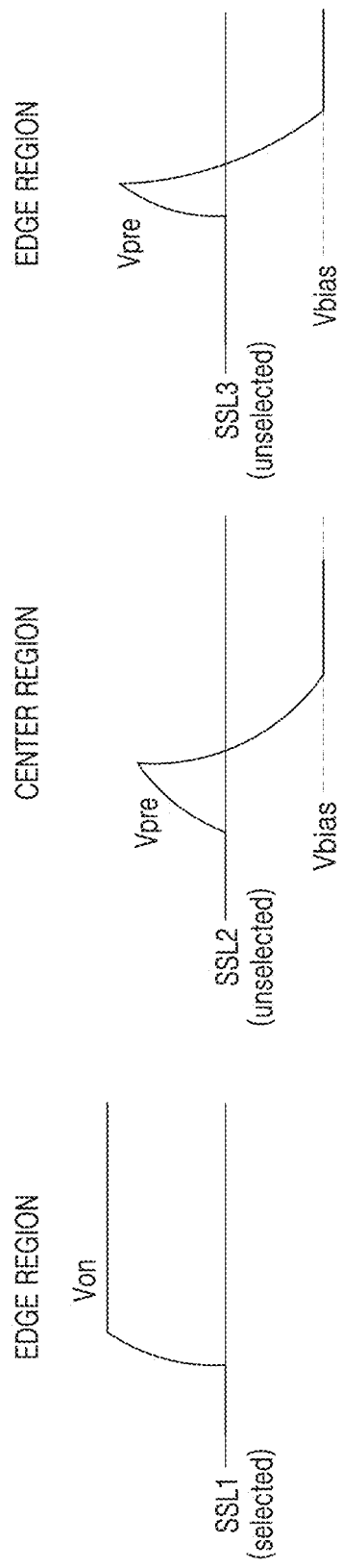
FIGS. 4A and 4B are views illustrating voltages applied to string selection lines according to some example embodiments of the inventive concepts.
Figure 4B:
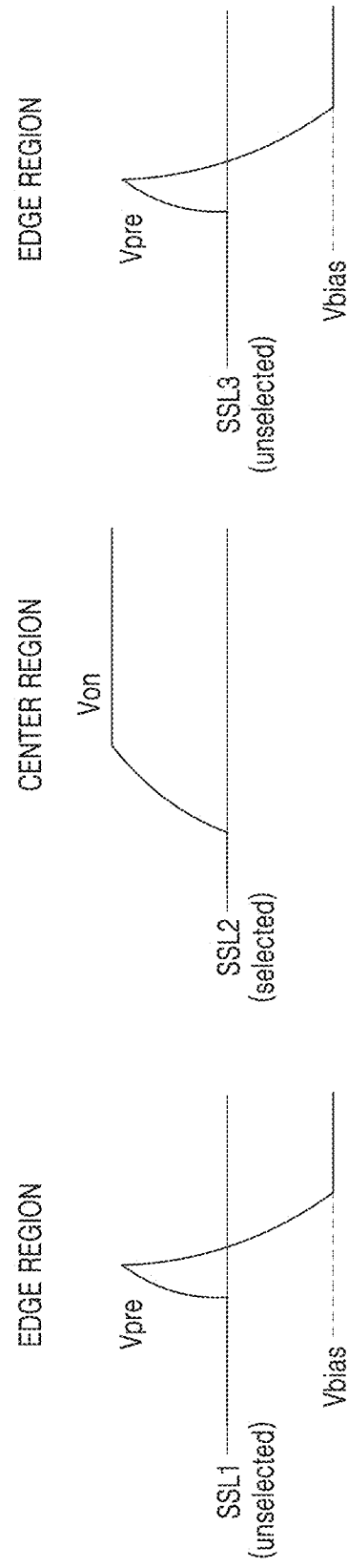

FIGS. 4A and 4B are views illustrating voltages applied to string selection lines according to some example embodiments of the inventive concepts.

Referring to FIGS. 3, 4A and 4B, it is assumed that the first string selection line SSL1 is connected to first vertical channel structures 15 belonging to an edge region between the first word line cut region 11 and the first string selection line cut region 13, the second string selection line SSL2 is connected to second vertical channel structures 16 belonging to a center region between the first string selection line cut region 13 and the second string selection line cut region 14, and the third string selection line SSL3 is connected to third vertical channel structures 17 belonging to an edge region between the second string selection line cut region 14 and the second word line cut region 12.

FIG. 4A corresponds to a case in which the first string selection line SSL1 is a selected string line and the second and third string selection lines SSL2 and SSL3 are unselected string lines. FIG. 4B corresponds to a case in which the second string selection line SSL2 is a selected string line and the first and third string selection lines SSL1 and SSL3 are unselected string lines.

Referring to FIG. 4A, a turn-on voltage Von may be applied to the first string selection line SSL1. A prepulse voltage Vpre may be applied to the second and third string selection lines SSL2 and SSL3. Thereafter, a bias voltage Vbias of a negative level may be applied. In this case, resistances of the second and third string selection lines SSL2 and SSL3 are different from each other and thus pre-pulse operation performance times of the second and third string selection lines SSL2 and SSL3 may be different from each other. The pre-pulse operation performance time may be understood as a time required for a string selection transistor connected to a string selection line to be turned off, starting from the application of the prepulse voltage Vpre. A voltage of the second string selection line SSL2 may increase and reduce more gently than a voltage of the third string selection line SSL3.

Referring to FIG. 4B, the turn-on voltage Von may be applied to the second string selection line SSL2. The prepulse voltage Vpre may be applied to the first and third string selection lines SSL1 and SSL3. Thereafter, a bias voltage Vbias of a negative level may be applied. Voltages of the first and third string selection lines SSL1 and SSL3 may increase more steeply than a voltage of the second string selection line SSL2.

In some example embodiments, the level of the prepulse voltage Vpre applied to an unselected string selection line may be lower than that of the turn-on voltage Von applied to a selected string selection line.

In some example embodiments, it is illustrated that a level of the bias voltage Vbias applied to the second string selection line SSL2 of FIG. 4A and a level of the bias voltage Vbias applied to the first and third string selection lines SSL1 and SSL3 of FIG. 4B are the same but example embodiments are not limited thereto. In some example embodiments, a level of the bias voltage Vbias applied to a selected string selection line in the center region may be lower than that of the bias voltage Vbias applied to a selected string selection line in an edge region.

Figure 5:
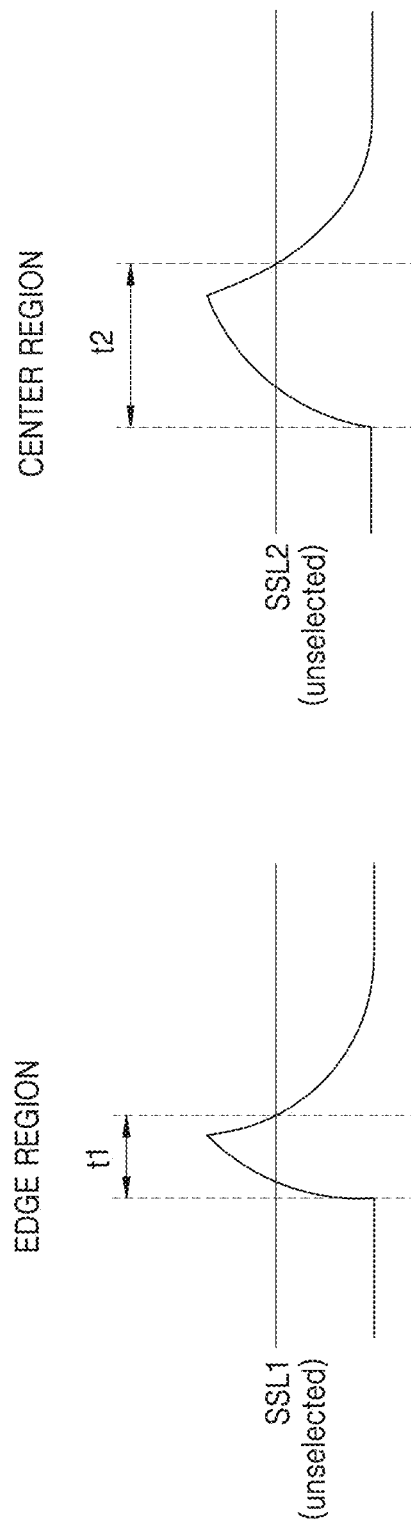
FIG. 5 is a view illustrating a prepulse operation performance time according to a comparative example.

FIG. 5 is a view illustrating a prepulse operation performance time according to a comparative example. FIG. 6A is a view illustrating a prepulse operation performance time according to some example embodiments of the inventive concepts.

Referring to FIGS. 5 and 6A, first to fourth times t1 to t4 may correspond to a prepulse time. It is assumed that first and second string selection lines SSL1 and SSL2 are unselected string selection lines and a third string selection line SSL3 is a selected string selection line. That is, the prepulse voltage Vpre is applied to the first and third string selection lines SSL1 and SSL3. The second time t2 may be longer than the first time t1 and the fourth time t4 may be longer than the third time t3.

Referring to FIG. 5, the prepulse voltage Vpre may be applied to the first and second string selection lines SSL1 and SSL2, and the bias voltage Vbias that is the same as a ground voltage may be applied thereto. The first and second string selection lines SSL1 and SSL2 may be activated by the prepulse voltage Vpre and deactivated by the bias voltage Vbias.

In this case, the first time t1 represents a time until a first string selection transistor connected to the first string selection line SSL1 is turned off, starting from turning on of the first string selection transistor, and the second time t2 represents a time until a second string selection transistor connected to the second string selection line SSL is turned off, starting from turning on of the second string selection transistor.

Referring to FIG. 6A, the prepulse voltage Vpre may be applied to the first and second string selection lines SSL1 and SSL2, and the bias voltage Vbias that is lower than the ground voltage may be applied thereto. The first and second string selection lines SSL1 and SSL2 may be activated by the prepulse voltage Vpre and deactivated by the bias voltage Vbias.

In this case, by applying the bias voltage Vbias of a negative level, the first and second string selection lines SSL1 and SSL2 may be deactivated more quickly than those of the comparative example. Specifically, in the first string selection line SSL1 in the edge region, the time t3 for performing the prepulse operation according to some example embodiments of the inventive concepts may be shorter than the time t1 for performing the prepulse operation of the comparative example. In the second string selection line SSL2 in the center region, the time t4 for performing the prepulse operation according to some example embodiments of the inventive concepts may be shorter than the time t2 for performing the prepulse operation of the comparative example.

Figure 6B:
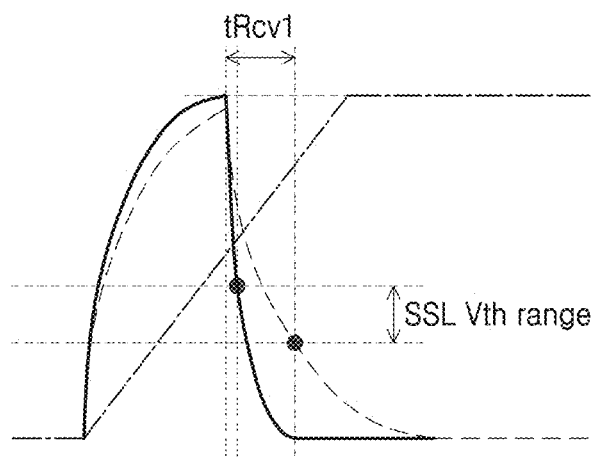
FIG. 6B is a view illustrating a prepulse recovery performance time according to a comparative example.
Figure 6C:
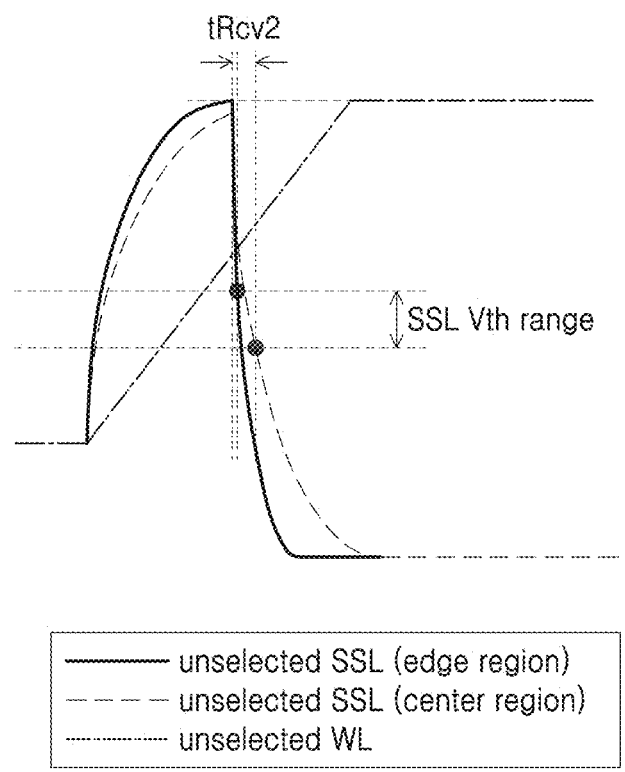
FIG. 6C is a view illustrating a prepulse recovery performance time according to some example embodiments of the inventive concepts.

FIG. 6B is a view illustrating a prepulse recovery performance time according to a comparative example. FIG. 6C is a view illustrating a prepulse recovery performance time according to some example embodiments of the inventive concepts. A time required to reach from a maximum value of a prepulse voltage to a lower limit of a threshold voltage range SSL Vth range of a string selection line is referred to as a recovery time.

Referring to FIGS. 6B and 6C, a recovery time of an unselected string selection line in a center region may be longer than that of an unselected string selection line in an edge region.

According to some example embodiments of the inventive concepts, a recovery time tRcv2 of an unselected string selection line in the center region may be shorter than a recovery time tRcv1 according to the comparative example. That is, as a bias voltage of a negative level is applied to unselected string selection lines after the prepulse operation, a cell string connected to an unselected string selection line among a plurality of cell strings sharing a bit line may be turned off more quickly. Accordingly, a level of a bit line of a cell string connected to a selected string selection line may be stabilized more quickly.

Figure 7:
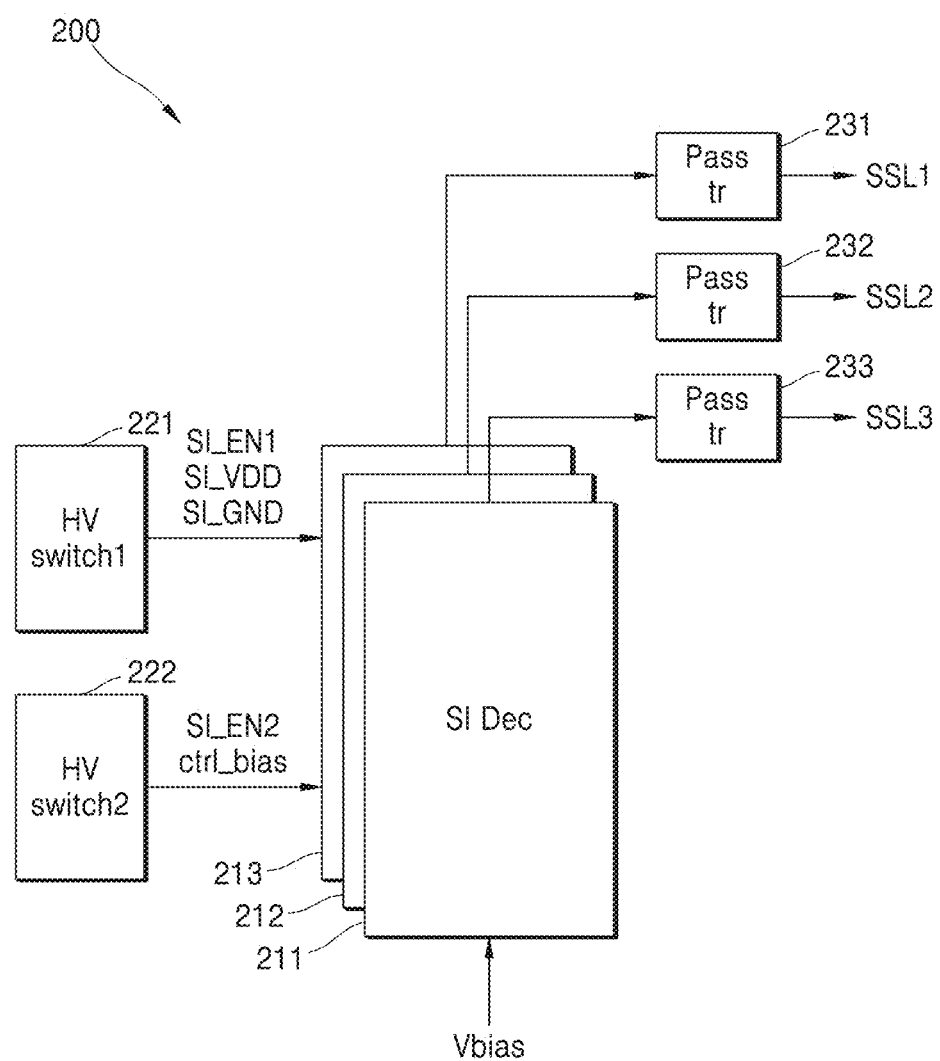
FIG. 7 is a block diagram of a row decoder according to some example embodiments of the inventive concepts.

FIG. 7 is a block diagram of a row decoder according to some example embodiments of the inventive concepts. The row decoder 200 may correspond to some example embodiments of the row decoder 160 of FIG. 1.

Referring to FIG. 7, the row decoder 200 may include first and second high-voltage switches 221 and 222, a plurality of signal line decoders 211, 212, and 213, and a plurality of pass transistors 231, 232, and 233.

The first and second high-voltage switches 221 and 222 may receive a plurality of high voltages generated from the voltage generator 150 of FIG. 1 and provide the plurality of high voltages to the plurality of signal lines decoders 211, 212, and 213. The plurality of high voltages may be control signals for controlling switches included in the plurality of signal line decoders 211, 212, and 213.

For example, the first high voltage switch 221 may receive a first enable signal SI_EN1, a power supply voltage control signal SI_VDD, and a ground voltage control signal SI_GND and provide them to the plurality of signal line decoders 211, 212, and 213. The second high voltage switch 222 may receive a second enable signal SI_EN2 and a bias voltage control signal ctrl bias and provide them to the plurality of signal line decoders 211, 212, and 213. In FIG. 7, the first and second high voltage switches 221 and 222 are illustrated as being separated from each other but may be embodied together as one switch.

Each of the signal line decoders 211, 212, and 213 may be connected to at least one of the string selection lines SSL1, SSL2, and SSL3 through one of the pass transistors 231, 232, and 233. Each of the signal line decoders 211, 212, and 213 may supply a voltage to one of the string selection lines SSL1, SSL2, and SSL3, based on signals provided from the first and second high voltage switches 221 and 222. According to some example embodiments of the inventive concepts, each of the signal line decoders 211, 212, and 213 may apply a prepulse voltage Vpre of a positive level and a bias voltage Vbias of a negative level to one of the string selection lines SSL1, SSL2, and SSL3.

For example, the first signal line decoder 211 may apply a power supply voltage to the first string selection line SSL1, based on the power supply voltage control signal SI_VDD, apply a ground voltage to the first string selection line SSL1, based on the ground voltage control signal SI_GND, and apply a bias voltage Vbias of a negative level to the first string selection line SSL1, based on the bias voltage control signal ctrl bias).

Each of the plurality of pass transistors 231, 232, and 233 may be connected between one of the plurality of signal line decoders 211, 212, and 213 and one of the plurality of string selection lines SSL1, SSL2, and SSL3, and apply a high voltage and a voltage of a negative level. Accordingly, each of the plurality of pass transistors 231, 232, and 233 may be embodied as a high-voltage transistor or a triple well type (field-effect) transistor (also referred to as a triple well type transistor or triple-well N type MOS transistor) 300 of FIG. 9.

Figure 8:
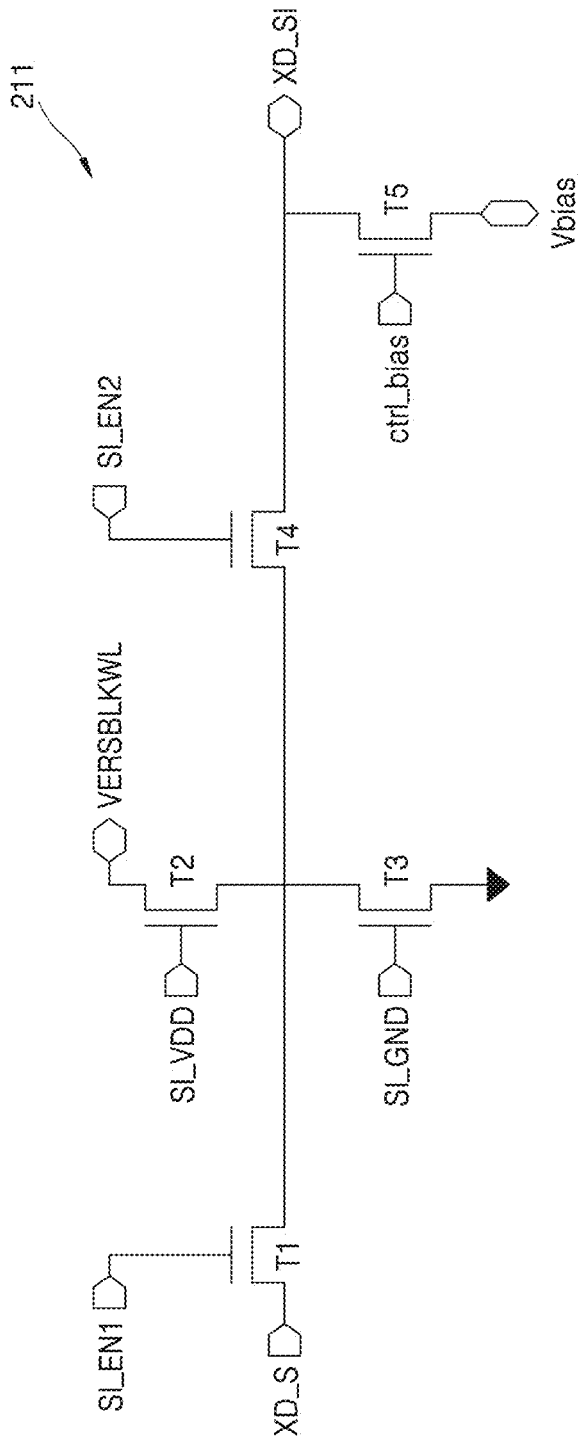
FIG. 8 is a circuit diagram of a signal line decoder according to some example embodiments of the inventive concepts.

FIG. 8 is a circuit diagram of a signal line decoder according to some example embodiments of the inventive concepts. The signal line decoder 211 of FIG. 8 may correspond to the first signal line decoder 211 of FIG. 7.

Referring to FIG. 8, the signal line decoder 211 may include first to fifth transistors T1 to T5. For example, the first to fifth transistors T1 to T5 may be N type transistors. In this case, each of the fourth and fifth transistors T4 and T5 may be embodied as the triple well type transistor 300 of FIG. 9.

The first and fourth transistors T1 and T4 are connected in series between a first input pin XD_S and an output pin XD_SI. The second and third transistors T2 and T3 are connected in series between a second input pin VERS-BLKWL and a ground line. The fifth transistor T5 is connected between the output pin XD_SI and a third input pin Vbias.

The first transistor T1 is controlled by a first enable signal SI_EN1, the second transistor T2 is controlled by a power supply voltage control signal SI_VDD, the third transistor T3 is controlled by a ground voltage control signal SI_GND, the fourth transistor T4 is controlled by a second enable signal SI_EN2, and a fifth transistor T5 is controlled by a bias voltage control signal ctrl bias.

The first to third transistors T1 to T3 may be used to output a prepulse voltage Vpre of a positive level. The fourth and fifth transistors T4 and T5 may be used to output a bias voltage Vbias of a negative level.

When the application of the prepulse voltage Vpre ends, the fourth transistor T4 may be turned off to disconnect the first to third transistors T1 to T3 from the output pin XD_SI. When the fifth transistor T5 is turned on, the bias voltage Vbias applied through the third input pin Vbias may be provided to the output pin XD_SI.

Figure 9:
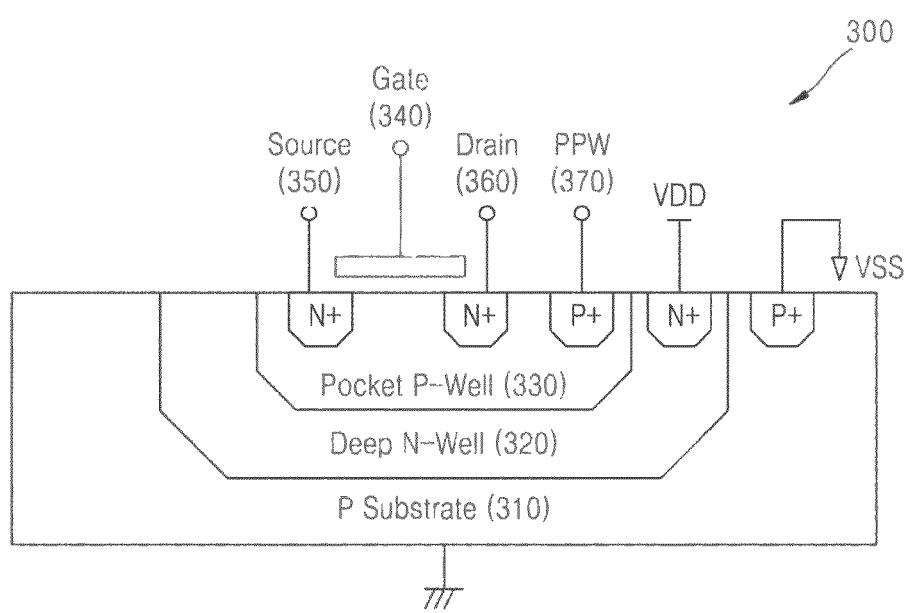
FIG. 9 is a cross-sectional view of a triple-well N type MOS transistor.

FIG. 9 is a cross-sectional view of the triple-well N type MOS transistor. The triple-well N type MOS transistor 300 of FIG. 9 may be some example embodiments of the plurality of pass transistors 231, 232, and 233 of FIG. 7 and the fourth and fifth transistors T4 and T5 of FIG. 8.

Referring to FIG. 9, the triple-well N type MOS transistor 300 may include a P type substrate 310, a deep N-well 320, a pocket P-well 330, a gate 340, a source 350, and a drain 360. The P type substrate 310 is biased to a ground voltage VSS and the deep N-well 320 is biased to a power supply voltage VDD. In some example embodiments, the deep N-well 320 may be biased to the ground voltage VSS, similar to the P type substrate 310. The pocket P-well 330 is biased by a voltage applied to a pocket P-well terminal (PPW) 370.

In some example embodiments, the PPW 370 may be connected to the negative charge pump 151 of FIG. 1 and thus the pocket P-well 330 may be biased to a voltage of a negative level.

Figure 10:
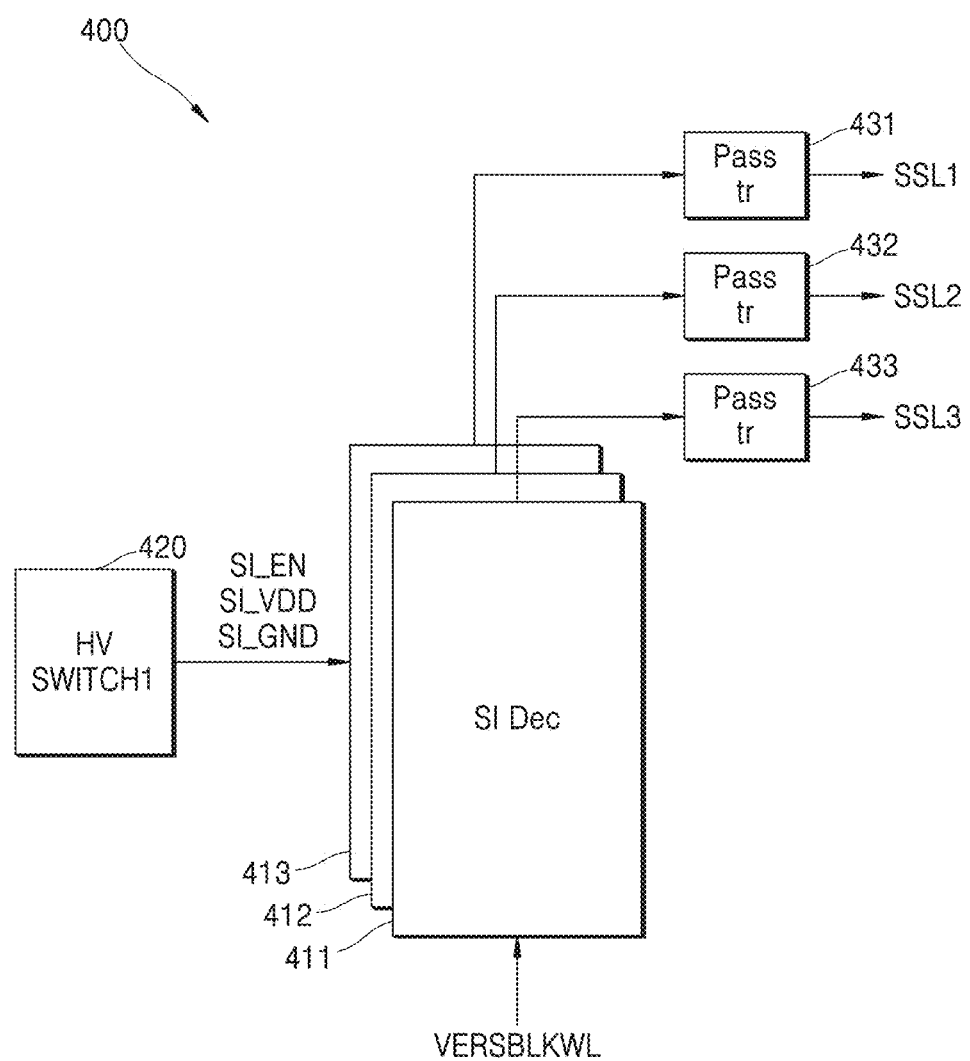
FIG. 10 is a block diagram of a row decoder according to some example embodiments of the inventive concepts.

FIG. 10 is a block diagram of a row decoder according to some example embodiments of the inventive concepts.

The row decoder 400 may include a high voltage switch 420, a plurality of signal line decoders 411, 412, and 413, and a plurality of pass transistors 431, 432, and 433.

The high voltage switch 420 may receive a plurality of high voltages generated from the voltage generator 150 of FIG. 1 and provide the plurality of high voltages to the plurality of signal line decoders 411, 412, and 413. The plurality of high voltages may be control signals for controlling switches included in the plurality of signal line decoders 411, 412, and 413.

For example, the high voltage switch 420 may receive an enable signal SI_EN, a power supply voltage control signal SI_VDD, and a ground voltage control signal SI_GND and provide them to the plurality of signal line decoders 411, 412 and 413.

The plurality of signal line decoders 411, 412, and 413 may be respectively connected to a plurality of string selection lines SSL1, SSL2, and SSL3 through the plurality of pass transistors 431, 432, and 433. Each of the signal line decoders 411, 412, and 413 may supply a voltage to one of the string selection lines SSL1, SSL2, and SSL3, based on signals provided from the high voltage switch 420. According to some example embodiments of the inventive concepts, each of the signal line decoders 411, 412, and 413 may apply a prepulse voltage Vpre of a positive level and a bias voltage Vbias of a negative level to one of the string selection lines SSL1, SSL2, and SSL3.

For example, the first signal line decoder 411 may apply a power supply voltage to the first string selection line SSL1, based on the power supply voltage control signal SI_VDD, and apply a ground voltage to the first string selection line SSL1, based on the ground voltage control signal SI_GND.

In this case, a voltage of a negative level may be supplied to the first signal line decoder 411 through a second input pin VERSBLKWL. Thus, the first signal line decoder 411 may apply a bias voltage Vbias of a negative level to the first string selection line SSL1, based on the power supply voltage control signal SI_VDD and the ground voltage control signal SI_GND.

Each of the plurality of pass transistors 431, 432, and 433 may be connected between one of the plurality of signal line decoders 411, 412, and 413 and one of the plurality of string selection lines SSL1, SSL2, and SSL3, and apply a high voltage and a voltage of a negative level. Accordingly, each of the plurality of pass transistors 431, 432, and 433 may be embodied as a high-voltage transistor or the triple well type transistor 300 of FIG. 9.

Figure 11:
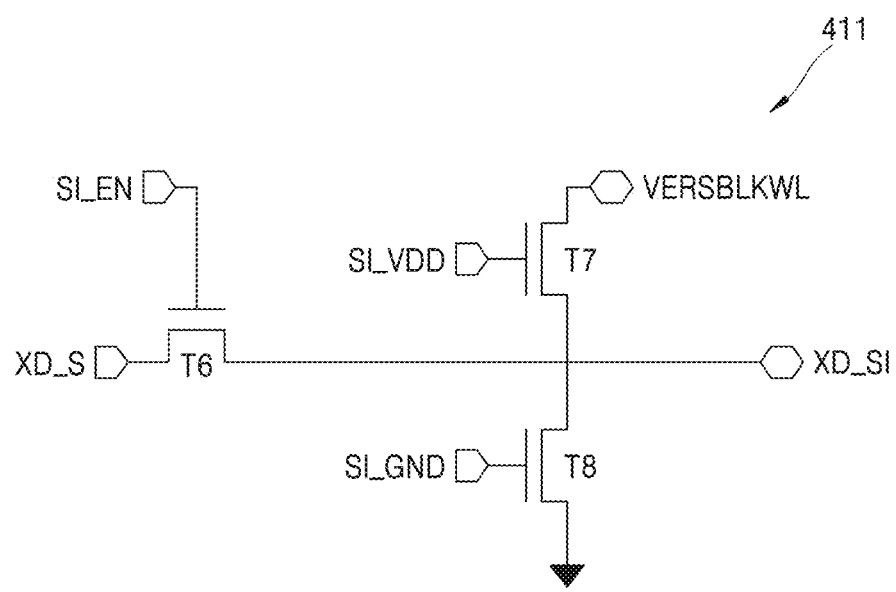
FIG. 11 is a circuit diagram of a signal line decoder according to some example embodiments of the inventive concepts.

FIG. 11 is a circuit diagram of a signal line decoder according to some example embodiments of the inventive concepts. The signal line decoder 411 of FIG. 11 may correspond to the first signal line decoder 411 of FIG. 10.

Referring to FIG. 11, the signal line decoder 411 may include sixth to eighth transistors T6 to T8. For example, the sixth to eighth transistors T6 to T8 may be N type transistors and may be each embodied as the trip well type transistor 300 of FIG. 9.

The sixth transistor T6 is connected between a first input pin XD_S and an output pin XD_SI. The seventh and eighth transistors T7 and T8 are a pull-up transistor and a pull-down transistor, respectively, and are connected in series between a second input pin VERSBLKWL and a grounding line.

The sixth transistor T6 is controlled by an enable signal SI_EN, the seventh transistor T7 is controlled by a power supply voltage control signal SI_VDD, and the eighth transistor T8 is controlled by a ground voltage control signal SI_GND.

In a prepulse period, a voltage of a positive level may be applied to the second input pin VERSBLKWL, so that the sixth to eighth transistors T6 to T8 may output a prepulse voltage Vpre of a positive level. The sixth transistor T6 may be turned on to apply the prepulse voltage Vpre to a pass transistor.

Thereafter, when the application of the prepulse voltage Vpre ends, a voltage of a negative level may be applied to the second input pin VERSBLKWL, so that the sixth to eighth transistors T6 to T8 may output a bias voltage Vbias of a negative level. For example, the second input pin VERSBLKWL may be connected to the negative charge pump 151 of FIG. 1.

Figure 12:
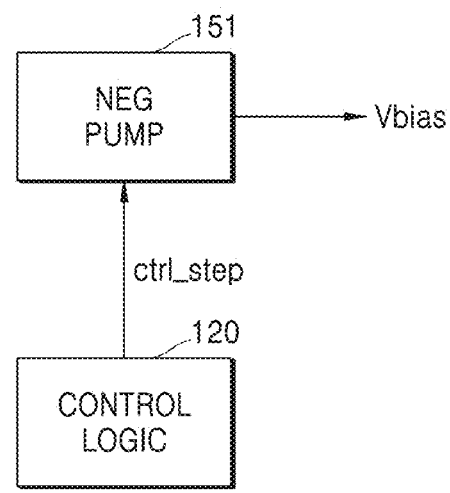
FIG. 12 is a block diagram of part of a memory device according to some example embodiments of the inventive concepts.
Figure 13:
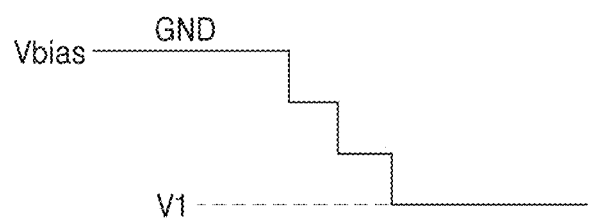
FIG. 13 is a view illustrating a bias voltage according to some example embodiments of the inventive concepts.

FIG. 12 is a block diagram of part of a memory device according to some example embodiments of the inventive concepts. FIG. 13 is a view illustrating a bias voltage according to some example embodiments of the inventive concepts. The control logic circuit 120 and the negative charge pump 151 of FIG. 12 may correspond to some of the example embodiments of Referring to FIGS. 12 and 13, the negative charge pump 151 may receive a step control signal ctrl_step from the control logic circuit 120. The negative charge pump 151 may generate a plurality of voltages that gradually reduce in response to the step control signal ctrl_step.

The negative charge pump 151 may generate a voltage of a negative level to be applied to a word line while generating a bias voltage Vbias of a negative level to be applied to a plurality of unselected strings selection lines. In this case, when the bias voltage Vbias of a target level is output directly, a peak current exceeding a permissible range of the memory device may occur.

Therefore, the negative charge pump 151 may sequentially generate, as the bias voltage Vbias, a plurality of voltages that reduce gradually from a level of a ground voltage GND to a target voltage level V1. Accordingly, a risk of occurrence of the peak current may be reduced. Each of the plurality of voltages may have a level between the level of the ground voltage GND and the target voltage level V1. The target voltage level V1 may be a negative level.

Figure 14:
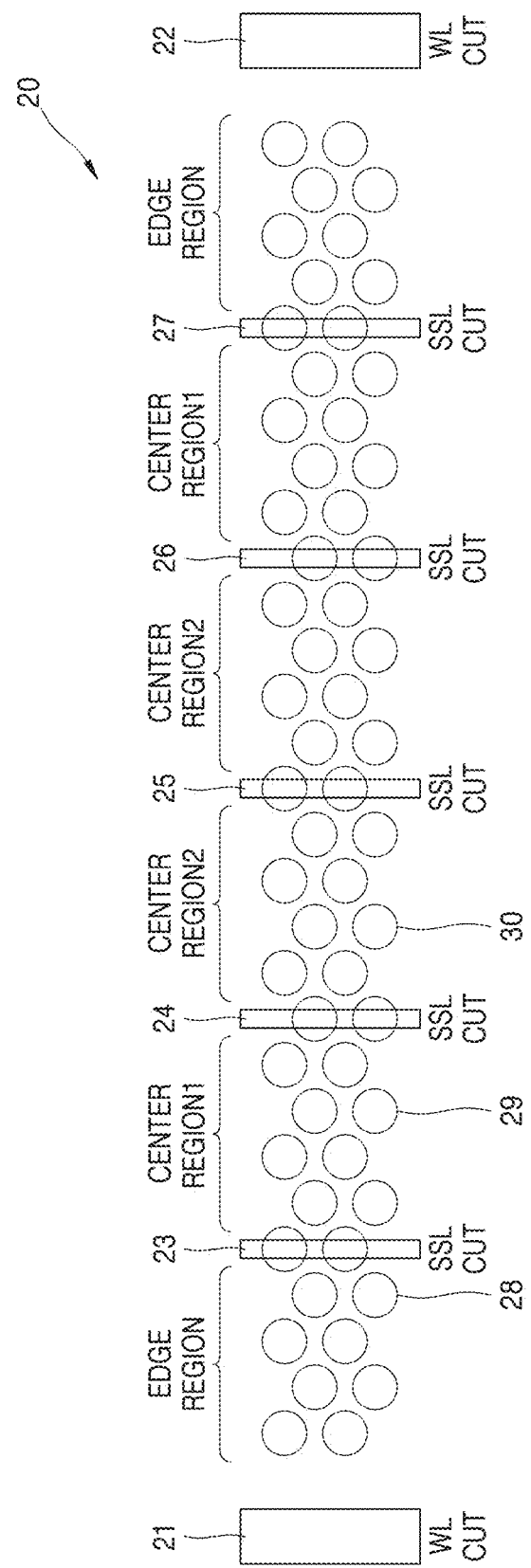
FIG. 14 is a view illustrating a layout of a memory cell array according to some example embodiments of the inventive concepts.

FIG. 14 is a view illustrating a layout of a memory cell array according to some example embodiments of the inventive concepts.

A layout 20 of FIG. 14 may be similar to the layout 10 of FIG. 3 and thus a description of parts thereof that are the same as those of the layout 10 will be omitted here.

Referring to FIG. 14, the layout 20 may include the first to fifth string selection line cut regions 23 to 27 between first and second word line cut regions 21 and 22. In this case, the layout 10 may be divided into edge regions or center regions with respect to the first and second word line cut regions 21 and 22 and the first to fifth string selection line cut regions 23 to 27.

The edge regions are regions adjacent to the first or second word line cut region 21 or 22, and the center regions are regions between the first to fifth string selection line cut regions 23 to 27. A plurality of center region may be provided, wherein first center regions may be center regions relatively close to the first or second word line cut region 21 or 22 and second center regions may be center regions relatively distant from the first or second word line cut region 21 or 22. For example, the first center regions may be a region between the first string selection line cut region 23 and the second string selection line cut region 24 and a region between the fourth string selection line cut region 26 and the fifth string selection line cut region 27, and the second center region may be a region between the second string selection line cut region 24 and the third string selection line cut region 25 and a region between the third string selection line cut region 25 and the fourth string selection line cut region 26.

In some example embodiments, it is assumed that a first string selection line SSL1 is connected to a plurality of vertical channel structures 28 belonging to an edge region adjacent to the first word line cut region 21, a second string selection line SSL2 is connected to a plurality of vertical channel structures 29 belonging to a first center region relatively adjacent to the first word line cut region 21, and a third string selection line SSL3 is connected to a plurality of vertical channel structures 30 belonging to a second center region relatively adjacent to the first word line cut region 21.

Although not shown, a fourth string selection line may be connected to a plurality of vertical channel structures belonging to an edge region adjacent to the second word line cut region 22, a fifth string selection line may be connected to a plurality of vertical channel structures belonging to a first center region relatively adjacent to the second word line cut region 22, and a sixth string selection line may be connected to a plurality of vertical channel structures belonging to a second center region relatively adjacent to the second word line cut region 22.

In this case, a resistance of the third string selection line SSL3 is greater than a resistance of the second string selection line SSL2, and a resistance of the second string selection line SSL2 may be greater than a resistance of the first string selection line SSL1. Accordingly, a prepulse operation performance times of the first, second, and third string selection lines SSL1, SSL2, and SSL3 may increase sequentially.

Some example embodiments of the inventive concepts are also applicable to a layout with two or more string selection line cut regions.

FIG. 15A is a view illustrating voltages applied to string selection lines according to some example embodiments of the inventive concepts.

Referring to FIGS. 14 and 15A, it is assumed that all of the first to third string selection lines SSL1 to SSL3 are unselected string selection lines. Thus, a prepulse voltage Vpre may be applied to the first to third string selection lines SSL1 to SSL3.

Thereafter, a bias voltage Vbias of a negative level may be applied to the first to third string selection lines SSL1 to SSL3. In this case, a bias voltage Vbias of a first level V1, a bias voltage Vbias of a second level V2, and a bias voltage Vbias of a third level V3 may be applied to the first, second, and third string selection lines SSL1, SSL2, and SSL3, respectively. The third level V3 may be lower than the second level V2 and the second level V2 may be lower than the first level V1.

According to some example embodiments of the inventive concepts, a level of the bias voltage Vbias may be determined, based on a distance from a vertical channel structure to a word line cut region adjacent thereto. Accordingly, a variation of a prepulse operation performance time according to the distance from the vertical channel structure to the adjacent word line cut region may be reduced.

Figure 15B:
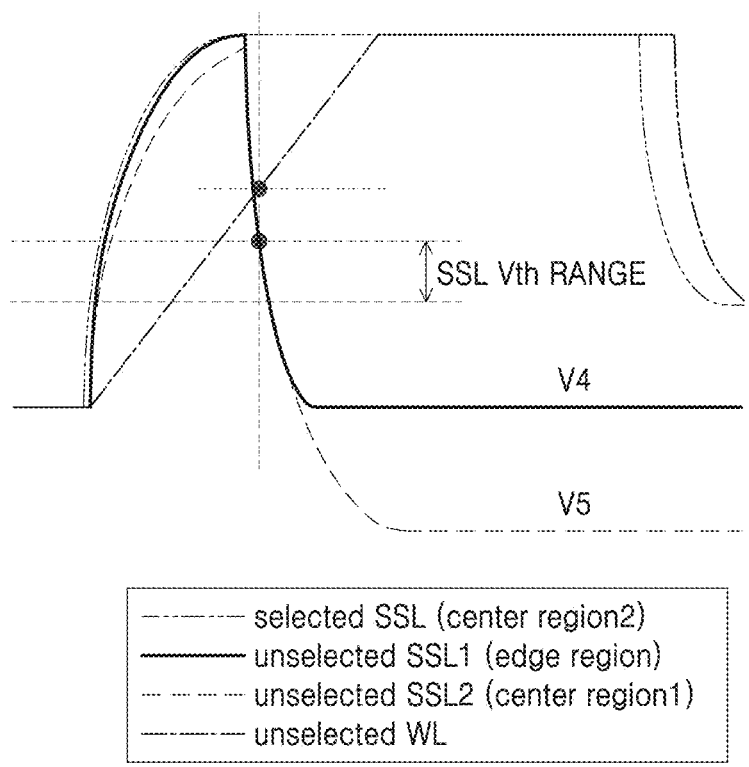
FIGS. 15B and 15C are views illustrating voltages applied to string selection lines according to some example embodiments of the inventive concepts.
Figure 15C:
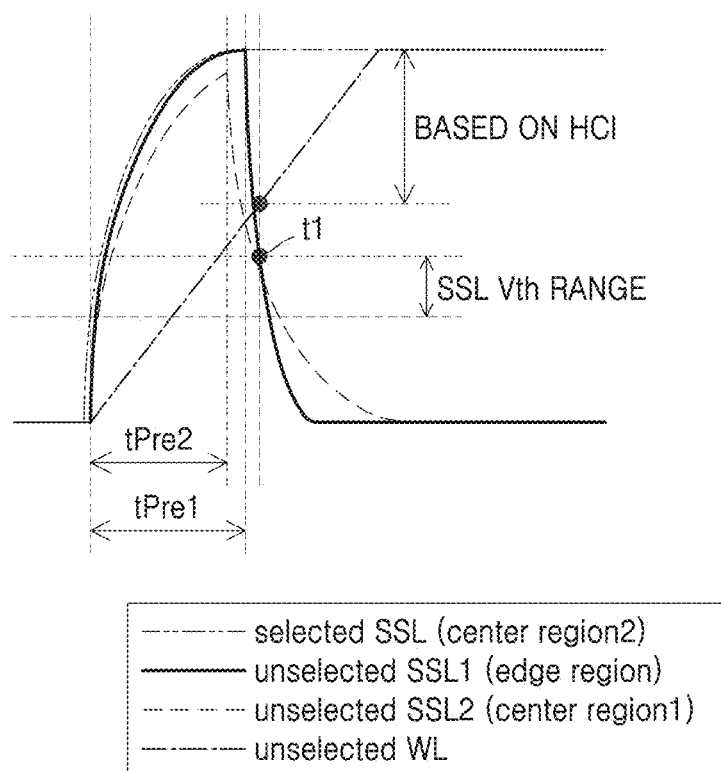

FIGS. 15B and 15C are views illustrating voltages applied to string selection lines according to some example embodiments of the inventive concepts.

Referring to FIG. 15B, it is assumed that a selected string selection line is connected to a plurality of vertical channel structures belonging to a second center region, a first unselected string selection line is connected to a plurality of vertical channel structures belonging to an edge region, and a second unselected string selection line is connected to a plurality of vertical channel structures belonging to a first center region. However, example embodiments are not necessarily limited thereto. For example, a selected string selection line may be connected to a plurality of vertical channel structures belonging to the first center region and first and second unselected string selection lines may be connected to a plurality of vertical channel structures belonging to the second center region and the edge region.

According to some example embodiments of the inventive concepts, a bias voltage of a negative level may be applied to at least one string selection line among a plurality of unselected string selection lines. For example, a bias voltage of the first unselected string selection line connected to the plurality of vertical channel structures belonging to the edge region may be a fourth voltage v4, and the fourth voltage v4 may be zero. A bias voltage of the second unselected string selection line connected to the plurality of vertical channel structures belonging to the first center region may be a fifth voltage v5, and the fifth voltage v5 may have a negative level.

A resistance of channel holes varies according to a position of a string selection line and thus a bias voltage of a negative level may be applied to only the second unselected string selection line in the first center region having a resistance relatively higher than that of the edge region. Accordingly, a voltage of the second unselected string selection line becomes less than or equal to a lower limit of a threshold voltage range SSL Vth range, thereby advancing a point in time when the second unselected string selection line is turned off.

Referring to FIG. 15C, prepulse times of a plurality of unselected string selection lines may be different from one another. For example, a second prepulse time tPre2 of a second unselected string selection line may be shorter than a first prepulse time tPre1 of a first unselected string selection line. Accordingly, a point in time that a voltage of the second unselected string selection line reaches an upper limit of the threshold voltage range SSL Vth range (e.g., a point in time t1 that turning off of the second unselected string selection line starts) and a point in time that a voltage of the first unselected string selection line reaches the upper limit of the threshold voltage range SSL Vth range (e.g., the point in time t1 that turning off of the first unselected string selection line starts) are controlled to be the same. In addition, a point in time when all of vertical channel structures connected to the second unselected string selection line are turned off, e.g., a point in time when the voltage of the second unselected string selection line reaches the lower limit of the threshold voltage range SSL Vth range, may be advanced.

Based on a first point in time, when a voltage of unselected word lines exceeds a certain level, channel structures connected to a turned-off unselected string selection line may be boosted, thus causing an HCI to occur. As a read operation is repeatedly performed, a reading disturbance may occur due to the HCI, thereby reducing the reliability of a memory cell. To prevent or reduce this problem, a maximum level of a voltage to be applied to unselected word lines may be determined, based on the first point in time. First and second prepulse times may be determined as values for satisfying the maximum level of the voltage applied to unselected word lines.

Some of the example embodiments of FIG. 15C are also applicable to a case in which a layout includes one center region and one edge region as shown in FIG. 3. In this case, the first unselected string selection line may be connected to the edge region and the second unselected string selection line may be connected to the center region.

Figure 16:
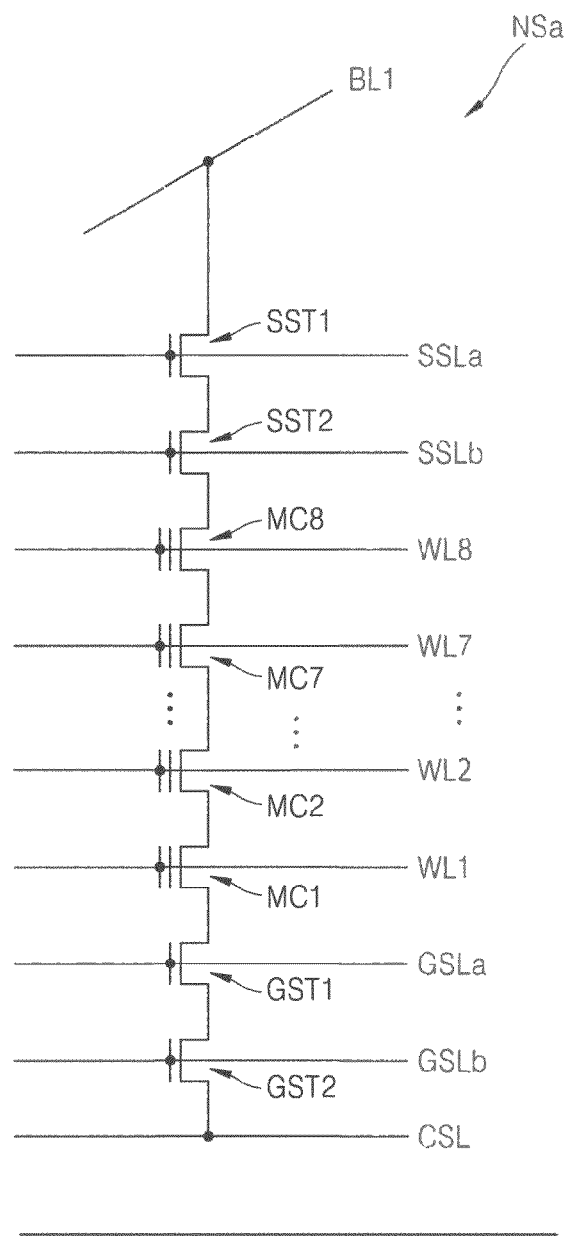
FIG. 16 is a circuit diagram of a cell string of a first memory block according to some example embodiments of the inventive concepts.

FIG. 16 is a block diagram of a cell string of a first memory device according to some example embodiments of the inventive concepts. A cell string NSa of FIG. 16 may correspond to one of the plurality of NAND strings NS11 to NS33 of FIG. 2.

Referring to FIG. 16, the cell string NSa may include at least one pair of string selection transistors SST1 and SST2, a plurality of memory cells (MC1, MC2-MC7, MC8), and at least one pair of ground selection transistors GST1 and GST2. A bit line BL may be connected to one end of a cell string CST" and a common source line CSL may be connected to another end of the cell string CST".

The at least one pair of string selection transistors SS1 and SST2 may be arranged at a side of each of the memory cells MC to be adjacent to each other. For example, the string selection transistors SST1 and SST2 may be arranged between the bit line BL and an $n^{th}$ memory cell MCn and connected in series to the $n^{th}$ memory cell MCn. The string selection transistors SST1 and SST2 may control the transmission of signals between the bit line BL and the memory cells MC. In this case, a first string selection line SSLa may be connected to the first string selection transistor SST1, and a second string selection line SSLb may be connected to the second string selection transistor SST2.

At least one ground selection transistors GST1 and GST2 may be arranged opposite to the string selection transistors SST1 and SSS2 and at another side of each of the memory cells MC to be adjacent to each other. For example, the ground selection transistors GST1 and GST2 may be arranged between the common source line CSL and a first memory cell MC1 and connected in series to the first memory cell MC1. The ground selection transistors GST1 and GST2 may control the transmission of signals between the common source line CSL and the memory cells MC. In this case, a first ground selection line GSLa may be connected to the first ground selection transistor GST1, and a second ground selection line GSLb may be connected to the second string selection transistor GST2.

According to some example embodiments of the inventive concepts, when the first and second string selection lines SSLa and SSLb are unselected string selection lines, a prepulse voltage Vpre and a bias voltage Vbias of a negative level may be applied to the first and second string selection lines SSLa and SSLb as described above with reference to FIGS. 1 to 15. In some example embodiments, bias voltages Vbias of different levels may be applied to the first and second string selection lines SSL1 and SSL2.

Figure 17:
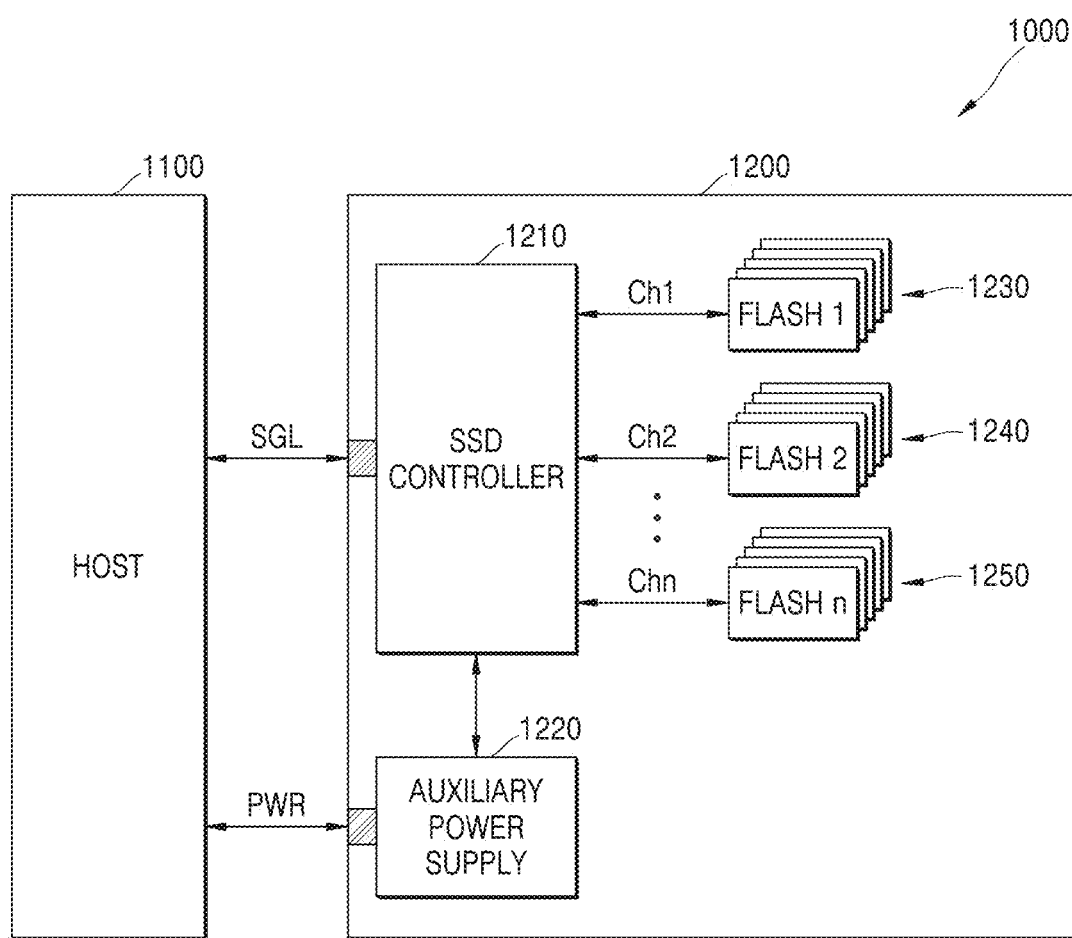
FIG. 17 is a block diagram of an SSD system with a memory device according to embodiments of the inventive concepts.

FIG. 17 is a block diagram of an SSD system with a memory device according to embodiments of the inventive concepts.

Referring to FIG. 17, an SSD system 1000 may include a host device 1100 and an SSD 1200. The SSD 1200 transmits signals to or receives signals SGL from the host device 1100 through a signal connector and is supplied with power PWR through a power connector. The SSD 1200 may include an SSD controller 1210, an auxiliary power supply device 1220, and a plurality of memory devices 1230, 1240, and 1250. The plurality of memory devices 1230, 1240, and 1250 may be a vertical stacked NAND flash memory device.

Each of the plurality of memory devices 1230, 1240, and 1250 may be implemented using the example embodiments described above with reference to FIGS. 1 to 16. Specifically, in a read operation or a program-verify operation performed on the plurality of memory devices 1230, 1240, and 1250, a prepulse operation may be performed on unselected string selection lines of a memory cell array and thereafter a bias voltage of a negative level may be applied thereto.

A memory card, a non-volatile memory device, and a card controller according to the inventive concepts may be mounted using packages of various forms. For example, a flash memory device, a memory controller, and/or a storage device according to the inventive concepts may be mounted using packages such as a package-on-package (PoP), ball grid arrays (BGAs), chip scale packages (CSPs), a plastic leaded chip carrier (PLCC), a plastic dual in-line package (PDIP), a die-in-waffle pack, a die-in wafer form, a chip-on-board (COB), a ceramic dual in-line package (CERDIP), a plastic metric quad flat pack (MQFP), a thin quad flat pack (TQFP), a small outline integrated circuit (SOIC), a shrink small outline package (S SOP), a thin small outline package (TSOP), a system-in-package (SIP), a multi-chip package (MCP), a wafer-level fabricated package (WFP), a wafer-level processed stack package (WSP), etc.

The memory device 100 (or other circuitry, for example, the control logic circuit 120, the voltage generator 150, the negative charge pump 151, the row decoder 160, the signal line decoder 161, row decoder 200 (400, etc.), the plurality of signal line decoders 211, 212, and 213, SSD system 1000, host device 1100, SSD 1200, SSD controller 1210, auxiliary power supply 1220, memory devices 1230, etc., subcomponents, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts has been particularly shown and described with reference to embodiments thereof, it will be understood that various changes in form and details may be made therein without departing from the spirit and scope of the following claims.

What is claimed is:

1. A memory device comprising:
a memory cell array including a plurality of memory cells and a plurality of string selection lines;
a negative charge pump configured to generate a bias voltage of a negative level, to be applied to at least one of the plurality of string selection lines; and
a control logic circuit configured to apply, for first period, a prepulse voltage to at least one unselected string selection line among the plurality of string selection lines excluding a selected string selection line to which a memory cell selected from among the plurality of memory cells is connected, and thereafter apply the bias voltage to the at least one unselected string selection line so as to perform a read operation on the selected memory cell.

2. The memory device of claim 1, further comprising:
a substrate including a first word line cut region and a plurality of string selection line cut regions, and
wherein a level of the bias voltage is based on whether the at least one unselected string selection line is provided in an edge region adjacent to the first word line cut region or a center region between the plurality of string selection line cut regions.

3. The memory device of claim 2, wherein
the negative charge pump is configured to generate a first bias voltage and a second bias voltage,
the control logic circuit is configured to apply the first bias voltage to a first unselected string selection line in the edge region and apply the second bias voltage to a second unselected string selection line in the center region, and
the second bias voltage is less than the first bias voltage.

4. The memory device of claim 3, wherein
the negative charge pump is further configured to generate a third bias voltage and a fourth bias voltage,
the center region comprises a first center region spaced a first distance from the first word line cut region and a second center region spaced a second distance from the first word line cut region, wherein the second distance is greater than the first distance
the control logic circuit is further configured to apply the third bias voltage to a third unselected string selection line in the first center region, and apply the fourth bias voltage to a fourth unselected string selection line in the second center region, and
the third bias voltage is less than or equal to the second bias voltage, and the fourth bias voltage is less than the third bias voltage.

5. The memory device of claim 1, wherein the negative charge pump is further configured to generate a plurality of voltages that reduce gradually from a ground voltage to the bias voltage.

6. The memory device of claim 1, further comprising:
a row decoder, the row decoder including,
a signal line decoder configured to receive a bias voltage control signal and the bias voltage, and the signal line decoder configured to output the bias voltage in response to the bias voltage control signal; and
a pass transistor connected to one of the at least one unselected string selection line and the signal line decoder.

7. The memory device of claim 6, wherein the pass transistor comprises a triple well type field-effect transistor (FET) including a deep well and a pocket well provided in the deep well and biased to a negative level voltage.

8. The memory device of claim 1, wherein the prepulse voltage has a positive level.

9. The memory device of claim 2, wherein the memory cell array further comprises a plurality of word lines stacked on the substrate in a vertical direction and connected to the plurality of memory cells.

10. A memory device for performing a read operation on a selected memory cell, the memory device comprising:
a memory cell array including a plurality of memory cells and a plurality of string selection lines;
a negative charge pump configured to generate a bias voltage of a negative level, to be applied to an unselected string selection line among the plurality of string selection lines excluding a string selection line to which the selected memory cell of the plurality of memory cells is connected; and
a row decoder configured to apply a prepulse voltage to the unselected string selection line for a first period and thereafter apply the bias voltage thereto for a second period.

11. The memory device of claim 10, wherein
the row decoder comprises
a signal line decoder; and
a pass transistor configured to connect the signal line decoder and the unselected string selection line,
the signal line decoder comprises
a first transistor configured to be turned off in the second period to block connection between at least one transistor and the pass transistor; and
a second transistor configured to be turned on in the second period to apply the bias voltage to the pass transistor, and
the at least one transistor is configured to apply the prepulse voltage to the pass transistor in the first period.

12. The memory device of claim 11, wherein each of the first transistor and the second transistor comprises a triple well type field-effect transistor (FET) including a deep well and a pocket well provided in the deep well and biased to a negative level voltage.

13. The memory device of claim 12, wherein the negative charge pump is further configured to
   apply the bias voltage to a drain of the second transistor; and
   apply a first voltage of a negative level to the pocket well of each of the first transistor and the second transistor.

14. The memory device of claim 10, wherein
the row decoder comprises
   a signal line decoder; and
   a pass transistor configured to connect the signal line decoder and the unselected string selection line, and
the signal line decoder comprises
   a first transistor configured to be turned on in the first period to apply the prepulse voltage to the pass transistor; and
   a pull-up transistor and a pull-down transistor each configured to apply the bias voltage to the pass transistor in the second period and connected in series between a first input pin and a ground node.

15. The memory device of claim 14, wherein each of the first transistor, the pull-up transistor and the pull-down transistor comprises a triple well type field-effect transistor (FET) including a deep well and a pocket well provided in the deep well and biased to a negative level voltage.

16. The memory device of claim 15, wherein the negative charge pump is further configured to
   apply the bias voltage to the first input pin; and
   apply a first voltage of a negative level to the pocket well of each of the first transistor, the pull-up transistor, and the pull-down transistor.

17. A memory device comprising:
a memory cell array comprising
   a first word line cut region and a second word line cut region;
   a plurality of string selection line cut regions between the first and second word line cut regions; and
   a plurality of vertical channel structures between the first word line cut region and the plurality of string selection line cut regions, between the second word line cut region and the plurality of string selection line cut regions, and between adjacent string selection line cut regions among the plurality of string selection line cut regions; and
a control logic circuit configured to
   apply a prepulse voltage to a first string selection line and a second string selection line connected to a plurality of unselected memory cells so as to perform a read operation on a selected memory cell,
   divide the plurality of vertical channel structures into first vertical channel structures and second vertical channel structures according to a distance to an adjacent word line cut region among the first and second word line cut regions, and
   apply different voltages to the first string selection line connected to the first vertical channel structures and the second string selection line connected to the second vertical channel structures after application of the prepulse voltage.

18. The memory device of claim 17, wherein the control logic circuit is further configured to apply different bias voltages of a negative level to the first string selection line and the second string selection line.

19. The memory device of claim 18, wherein a distance to the adjacent word line cut region from the first vertical channel structures is longer than a distance to the adjacent word line cut region from the second vertical channel structures, and
   a first bias voltage applied to the first string selection line is less than a second bias voltage applied to the second string selection line.

20. The memory device of claim 19, wherein a first prepulse operation performance time for applying the prepulse voltage to the first string selection line is longer than a second prepulse operation performance time for applying the prepulse voltage to the second string selection line.

* * * * *